(12) United States Patent
Jackson et al.

(10) Patent No.: US 10,026,896 B2
(45) Date of Patent: Jul. 17, 2018

(54) MULTILAYERED MEMRISTORS

(71) Applicant: Hewlett Packard Enterprise Development LP, Houston, TX (US)

(72) Inventors: Warren Jackson, San Francisco, CA (US); Jianhua Yang, Palo Alto, CA (US); Kyung Min Kim, Palo Alto, CA (US); Zhiyong Li, Foster City, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/500,050

(22) PCT Filed: Feb. 13, 2015

(86) PCT No.: PCT/US2015/015729
§ 371 (c)(1),
(2) Date: Jan. 28, 2017

(87) PCT Pub. No.: WO2016/130134
PCT Pub. Date: Aug. 18, 2016

(65) Prior Publication Data
US 2017/0271591 A1   Sep. 21, 2017

(51) Int. Cl.
*H01L 45/00* (2006.01)
*H01L 27/24* (2006.01)
*G11C 13/00* (2006.01)

(52) U.S. Cl.
CPC ........ *H01L 45/147* (2013.01); *G11C 13/0007* (2013.01); *G11C 13/0069* (2013.01);
(Continued)

(58) Field of Classification Search
None
See application file for complete search history.

(56) References Cited

U.S. PATENT DOCUMENTS 3,770,527 A * 11/1973 Maycock ............... C06B 43/00
149/74
7,733,685 B2   6/2010 Scheuerlein et al.
(Continued)

FOREIGN PATENT DOCUMENTS

WO   WO-2010150957   12/2010

OTHER PUBLICATIONS

Doolittle, W.A. et al., Complementaty Oxide Memristor Technology Facilitating Both Inhibitory and Excitatory Synapses for Potential Neuromorphic Computing Applications, Dec. 9-11, 2009, ISDRS 2009 IEEE, 2 pages.

(Continued)

*Primary Examiner* — Jay C Chang
(74) *Attorney, Agent, or Firm* — Hewlett Packard Enterprise Patent Department (57) ABSTRACT

A multilayered memristor includes a semiconducting n-type layer, a semiconducting p-type layer, and a semiconducting intrinsic layer. The semiconducting n-type layer includes one or both of anion vacancies and metal cations. The semiconducting p-type layer includes one or both of metal cation vacancies and anions. The semiconducting intrinsic layer is coupled between the n-type layer and the p-type layer to form an electrical series connection through the n-type layer, the intrinsic layer, and the p-type layer.

20 Claims, 5 Drawing Sheets

(52) U.S. Cl.
CPC ........ *H01L 27/2463* (2013.01); *H01L 45/085* (2013.01); *H01L 45/1233* (2013.01); *H01L 45/16* (2013.01)

(56) References Cited

U.S. PATENT DOCUMENTS

| | | |
|---|---|---|
| 8,274,130 B2 | 9/2012 | Mihnea et al. |
| 8,461,563 B2 | 6/2013 | Yasuda |
| 8,487,294 B2 | 7/2013 | Wen et al. |
| 8,520,424 B2 | 8/2013 | Kreupl et al. |
| 2004/0159867 A1 | 8/2004 | Kinney et al. |
| 2012/0091421 A1* | 4/2012 | Wen .................. G11C 13/0007 257/4 |
| 2012/0183837 A1* | 7/2012 | Johnson ................ H01M 4/366 429/156 |
| 2012/0218806 A1 | 8/2012 | Liu et al. |
| 2013/0273708 A1 | 10/2013 | Wen et al. |
| 2014/0061579 A1 | 3/2014 | Wei et al. |
| 2014/0192589 A1 | 7/2014 | Maxwell et al. |

OTHER PUBLICATIONS

International Searching Authority, The International Search Report and the Written Opinion, PCT/US2015/015729, dated Nov. 24, 2015, 13 Pages.

\* cited by examiner

MULTILAYERED MEMRISTORS

BACKGROUND

Memristors are devices that can be programmed to different resistive states by applying a programming energy, such as a voltage. Large crossbar arrays of memory devices can be used in a variety of applications, including random access memory, non-volatile solid state memory, programmable logic, signal processing control systems, pattern recognition, and other applications.

BRIEF DESCRIPTION OF THE DRAWINGS

The following detailed description references the drawings, wherein.

DETAILED DESCRIPTION

Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store a bit of information, such as a 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("ON") and one in which the channel forms a less conductive path ("OFF"). In some other cases, conductive paths represent "OFF" and less conductive paths represent "ON".

Using memristors in crossbar arrays may lead to read or write failure due to sneak currents passing through the memory cells that are not targeted—for example, cells on the same row or column as a targeted cell. Failure may arise when the total current through the circuit from an applied voltage is higher than the current through the targeted memristor due to current sneaking through untargeted neighboring cells. Using a transistor or a selector coupled in series with each memristor has been proposed to isolate each cell and overcome the sneak current. However, using an additional component with each memristor in a crossbar array may limit array density and increases cost, which may impact commercialization. As a result, nonlinear memristors are being investigated to mitigate the sneak current problems.

Examples herein provide for multilayered memristors which may be nonlinear and robust. In example implementations, a multilayered memristor may have a semiconducting n-type layer, a semiconducting p-type layer, and a semiconducting intrinsic layer. The semiconducting n-type layer includes one or both of anion vacancies and metal cations. The semiconducting p-type layer includes one or both of metal cation vacancies and anions. The semiconducting intrinsic layer is coupled between the n-type layer and the p-type layer to form an electrical series connection through the n-type layer, the intrinsic layer, and the p-type layer.

By combining two complementary types of memristive materials, namely one that is an n-type semiconductor and one that is a p-type semiconductor, multilayered memristors experience higher current-voltage (I-V) nonlinearity. When a voltage is applied across the memristor or a current driven through it, the charge carriers in the two materials form conducting filaments that may connect the memristor from one end to another. Accordingly, the state of the memristor may be switched from a relatively insulating state to a relatively conducting state. Furthermore, multilayered memristors may have conducting filaments which tend to have weak points that occur at the center of the filaments and away from adjacent components, such as electrodes.

In this manner, multilayered memristors may provide a number of characteristics. Multilayered memristors herein may have significant nonlinearity so that a selector may not be needed for effective use in a memristor crossbar array. The ratio of on to off resistance may be higher, which increases the reading and writing speeds. The control of the defects could improve durability and improve compatibility with more reactive electrodes. The structure enables higher resistance devices which are desirable for large scale memory arrays because of lower current and power consumption. Furthermore, the relatively simple structure and materials of example implementations lead to low processing costs and easier multilayer stacking. Accordingly, multilayered memristors herein may be desirable to use in crossbar arrays for various memristor applications.

Figure 1A:
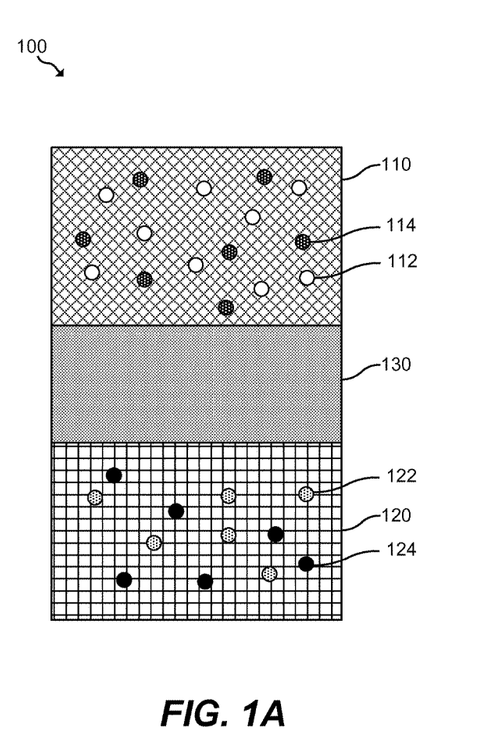
FIG. 1A is a diagram of a cross-sectional view of an example multilayered memristor.

Referring now to the figures FIG. 1A is a diagram of a cross-sectional view of an example multilayered memristor 100. Multilayered memristor 100 may have a semiconducting n-type layer 110, a semiconducting p-type layer 120, and a semiconducting intrinsic layer 130 coupled between n-type layer 110 and p-type layer 120 to form an electrical series connection through the n-type layer, the intrinsic layer, and the p-type layer. N-type layer 110 may have one or both of anion vacancies 112 and metal cations 114. P-type layer 120 may have one or both of metal cation vacancies 122 and anions 124.

Multilayered memristor 100 may be an electrical device or component that provides switching and memory properties. Specifically, multilayered memristor 100 may change resistance when a voltage is applied across it or a current is driven through it. Furthermore, multilayered memristor 100 may "memorize" its last resistance. In this manner, multilayered memristor 100 may be set to at least two states. Multilayered memristor 100 may switch from a first state to a second state when a write voltage is applied to the multilayered memristor 100. Multilayered memristor 100 may be based on a variety of materials as described herein.

Semiconducting n-type layer 110 may be or include an n-type extrinsic semiconductor. N-type layer 110 may have a larger electron concentration than hole concentration. In n-type layer 110, electrons may be the majority charge carriers and holes are the minority carriers. N-type layer 110 may have one or both of anion vacancies 112 and metal cations 114. The example in FIG. 1A shows n-type layer 110 having both. In some implementations, the anion vacancies 112 or the metal cations 114 or both may form a conducting first filament through the layer. This is described in detail in relation to FIG. 1B.

N-type layer 110 may include a number of materials, including $TaO_{2-x}$, indium zinc oxide (IZO), ZnO, InO, or MgO. In some implementations, n-type layer 110 may be based on a metal oxide such as $TaO_{2-x}$. In some examples, anion vacancies 112 may include oxygen anion vacancies. Metal cations 114 may include Indium, Zn, Mg, Sn, or Ga.

Semiconducting p-type layer 120 may be or include a p-type extrinsic semiconductor. P-type layer 120 may have a larger hole concentration than electron concentration. In p-type layer 120, holes may be the majority charge carriers and electrons are the minority carriers. P-type layer 120 may have one or both of metal cation vacancies 122 and anions 124. The example in FIG. 1A shows p-type layer 120 having both. In some implementations, the metal cation vacancies 122 or the anions 124 or both may form a conducting second filament through the layer. This is described in detail in relation to FIG. 1B.

P-type layer 120 may include a number of materials, including Zn—Rh—O, Zn—Co—O, Ln-M-O (Ln-M-O, where M=Ru, Ir, and Ln is a lanthanide element except Ce), La—Ru—O, Zn—Rh—O, Zn—Co—O, $MoO_3$, $V2O5$, O, and WO3. In some implementations, p-type layer 120 may be based on a metal oxide such as $NiO_{1-x}$, CuO, or $MnO_x$. Metal cation vacancies 122 may include Zn, Rh, Ir, Ln, W, V, Mo, Co, Ru, or La. In some examples, anions 124 may include oxygen anions.

Semiconducting intrinsic layer 130 may be coupled between n-type layer 110 and p-type layer 120 to form an electrical series connection through the layers of the memristor. Intrinsic layer 130 may be or include an intrinsic semiconductor. In some implementations, intrinsic layer 130 may permit the passage of both anion vacancies and metal cation vacancies. For example intrinsic layer 130 may allow anion vacancies from n-type layer 110 and metal cation vacancies from p-type layer 120 into the intrinsic layer to form a conducting third filament through intrinsic layer 130. This is described in detail below. In addition, intrinsic layer 130 may block the passage of anion vacancies and metal cation vacancies. Doing so may prevent the formation of a conducting filament in the intrinsic layer. The intrinsic layer can be selected to adjust properties of the multilayered memristor such as the formation voltage, the on/off resistance, diffusion of vacancies and interstitials, and durability under repeated switching.

The formation of the first, second, and third filaments in the n-type layer, the p-type layer, and the intrinsic layer, respectively, provides the low resistance state of the multilayered memristor. On the flipside, the breaking of the filaments provides the high resistance state of the memristor. Further details are provided below.

Furthermore, multilayered memristor 100 may exhibit nonlinear current-voltage (I-V) behavior. For example, linear materials may follow Ohm's law, where the current through them is proportional to the voltage. On the other hand, the current through multilayered memristor 100 may be small at low voltages, while the current increases disproportionately with increasing voltage. As a result, the I-V behavior in a voltage range may be highly nonlinear.

Figure 1B:
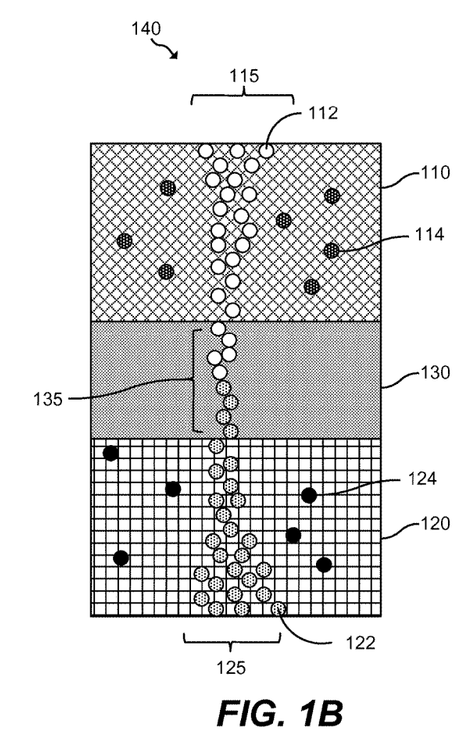
FIG. 1B is a diagram of a cross-sectional view of the example multilayered memristor of FIG. 1A when the memristor is in a low resistance state.

FIG. 1B is a diagram of a cross-sectional view of the example multilayered memristor 100 of FIG. 1A when the memristor is in a low resistance state. The multilayered memristor is labeled as 140 in relation to FIG. 1B. Multilayered memristor 140 may have n-type layer 110, p-type layer 120, and intrinsic layer 130. N-type layer 110 may have anion vacancies 112 and/or metal cations 114. P-type layer 120 may have metal cation vacancies 122 and/or anions 124. Intrinsic layer 130 may be coupled between n-type layer 110 and p-type layer 120 to form a continuous connection. When a voltage, such as a forming is applied across multilayered memristor 140, the charge carriers move to create conducting filaments in each of the layers.

In some implementations, voltage may be applied via electrodes coupled to the edges of the n-type layer and the p-type layer. With the applied voltage, charge carriers in the n-type layer 110, such as oxygen vacancies 112, may be drawn toward a top electrode to build a conducting first filament 115 within the layer. Analogously, charge carriers in the p-type layer 120, such as metal cation vacancies 122, may be drawn toward a bottom electrode to build a conducting second filament 125 within the layer. These filaments may connect the respective outer surfaces of the layers with the intrinsic layer 130.

The applied voltage may additionally cause the formation of a conducting third filament 135 in the intrinsic layer 130. Third filament 135 may connect the two edges of intrinsic layer 130 to create a conducting channel through the layer. When connected with the first filament 115 and the second filament 125, third filament 135 completes a conducting path through the multilayered memristor 140. In some implementations, third filament 135 may be formed by anion vacancies 112 of n-type layer 110 and by metal cation vacancies 122 of p-type layer 120. The connection of the first, second, and third filaments creates a continuous conducting path through the layers of multilayered memristor 140, thereby facilitating a relatively conducting, low resistance state.

Due to the orientation of the layers, first filament 115 and second filament 125 may grow from the outer edge of their respective layers towards the center of the memristor. As a result, the thinnest part of the connected filament may be towards the middle of the filament and away from the edges, where the filaments may connect with the external surfaces of their respective layers. In some implementations, electrodes may be coupled to the n-type layer 110 and p-type layer 120. Having the thinnest part, which is often the weak point, of the filament away from the electrodes may be beneficial especially if the electrode has a material that may be reactive with the ions of the layers.

Furthermore, because of the relative thinness of the filament near the center of the filament, heat may be generated via joule heating. The heat generated may enhance the transition between the low resistance state to the high resistance state at lower voltages. Because the thin part of the filament is towards the center, the heat generated may not be conducted away by electrodes, as may be the case with alternatives.

Figure 1C:
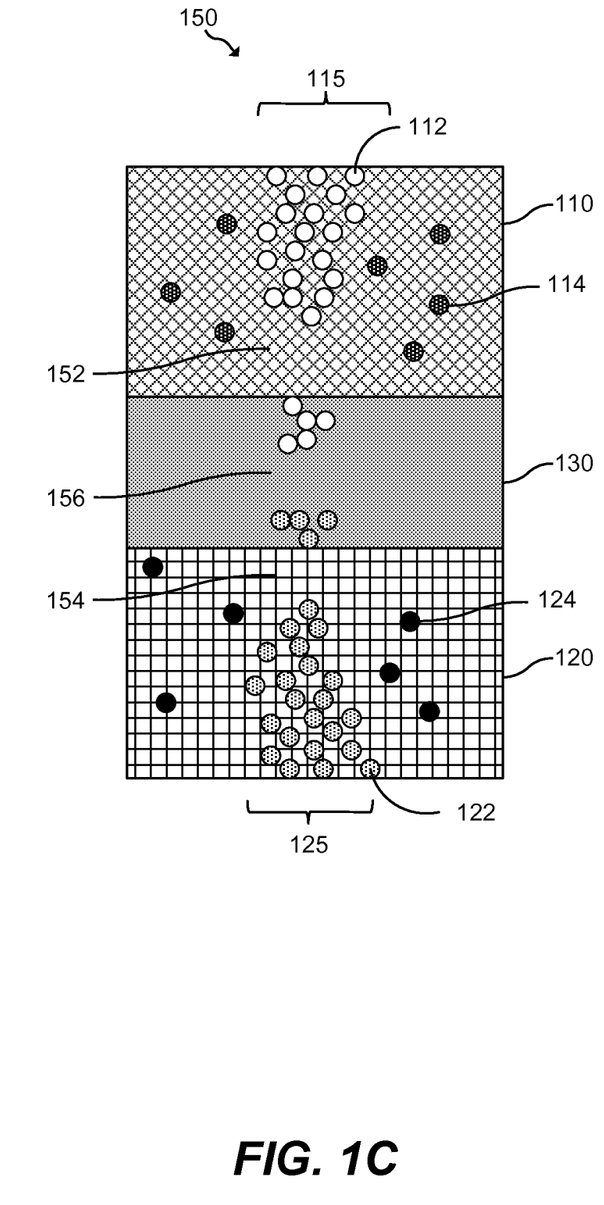
FIG. 1C is a diagram of a cross-sectional view of the example multilayered memristor of FIG. 1A when the memristor is in a high resistance state.

FIG. 1C is a diagram of a cross-sectional view of the example multilayered memristor 100 of FIG. 1A when the memristor is in a high resistance state. The multilayered memristor is labeled as 150 in relation to FIG. 1C. When a voltage, such as one of a reverse polarity of the one described in relation to FIG. 1B or one of a different magnitude, is applied across multilayered memristor 150 that is already in a low resistance state, the charge carriers, such as anion vacancies 112 and metal cation vacancies 122, move to break at least one of the conducting filaments. In other words, the multilayered memristor 150 may switch from the low resistance state due to a high resistance state due to the conducting filament being broken.

In some implementations, a voltage, which is different than the voltage described in relation to FIG. 1B, may be applied via electrodes coupled to the edges of the n-type layer and the p-type later. With the applied voltage, charge carriers in the n-type layer 110, such as oxygen vacancies 112, may be drawn away from first filament 115 to cause a break 152 in the filament. Analogously, charge carriers in the p-type layer 120, such as metal cation vacancies 122, may be drawn away from second filament 125 to cause a break 154 in the filament. Furthermore, the applied voltage may additionally cause a break 156 in third filament 135 in the intrinsic layer 130, by the movement of the charge carriers away from each other. The breaking of at least one of the first, second, and third filaments breaks the continuous conducting path through the layers of multilayered memristor 140, thereby facilitating a relatively insulating, high resistance state.

Furthermore, the structure of memristor 150 may mitigate sneak currents. Specifically, when the memristor is in a high resistance state ("OFF" state), the intrinsic layer 130 is a natural gap that prevents significant conductance of current through the memristor. As a result, this may naturally suppress sneak currents and may eliminate the need for selectors in some implementations.

Figure 2:
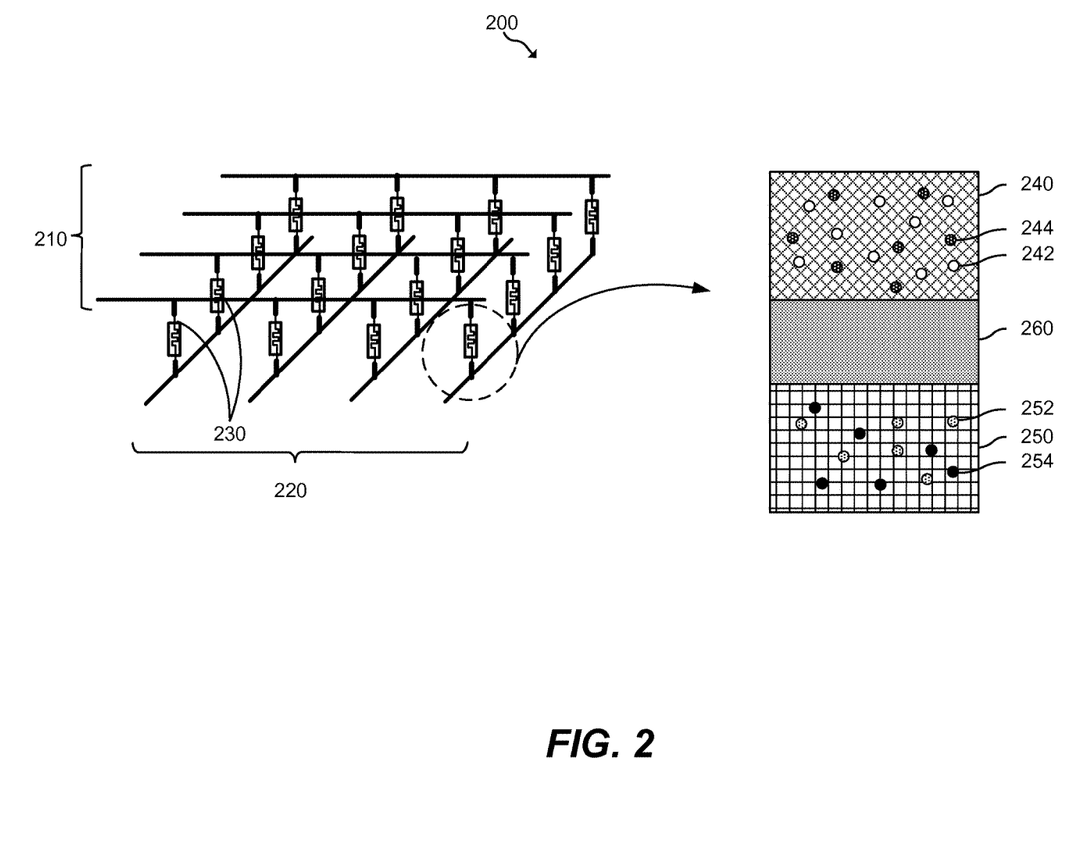
FIG. 2 is a diagram of an example crossbar array having a plurality of multilayered memristors.

FIG. 2 is a diagram of an example crossbar array 200 having a plurality of multilayered memristors 230. Crossbar array 200 may be a configuration of parallel and perpendicular lines with memristors and other components coupled between lines at cross-points. Such an architecture is generally referred to as a crossbar or cross-point array. Crossbar array 200 may include a plurality of row lines 210, a plurality of column lines 220, and a plurality of multilayered memristors 230. Each multilayered memristor may be coupled between a unique combination of one row line and one column line. In other words, no memory cells share both a row line and a column line. For example, each memristor may serve as a memory cell in a memory crossbar device.

Row lines 210 may be electrically conducting lines that carry current throughout crossbar array 200. Row lines 210 may be in parallel to each other, generally with equal spacing. Row lines 210 may sometimes be referred to as bit lines. Depending on orientation, row lines 210 may alternatively be referred to as word lines. Similarly, column lines 220 may be conducting lines that run perpendicular to row lines 210. Column lines 220 may be referred to as word lines in some conventions. In other orientations, column lines 220 may refer to bit lines. Row lines 210 and column lines 220 may be made of conducting materials, such as platinum (Pt), tantalum (Ta), hafnium (Hf), zirconium (Zr), aluminum (Al), cobalt (Co), nickel (Ni), iron (Fe), niobium (Nb), molybdenum (Mo), tungsten (W), copper (Cu), titanium (Ti), tantalum nitrides ($TaN_x$), titanium nitrides ($TiN_x$), $WN_2$, NbN, MoN, $TiSi_2$, TiSi, $Ti_5Si_3$, $TaSi_2$, $WSi_2$, $NbSi_2$, $V_3Si$, electrically doped Si polycrystalline, electrically doped Ge polycrystalline, and combinations thereof.

Row lines 210 and column lines 220 may serve as electrodes that deliver voltage and current to multilayered memristor 230. As shown in the zoomed-in view, memristor 230 may be analogous to multilayered memristor 100 of FIG. 1A, multilayered memristor 140 of FIG. 1B, and multilayered memristor 150 of FIG. 1C. Multilayered memristor 230 may have a semiconducting n-type later 240, a semiconducting p-type layer 250, and a semiconducting intrinsic layer 260 coupled between n-type layer 240 and p-type layer 250 to form an electrical series connection through the n-type layer, the intrinsic layer, and the p-type layer. N-type layer 240 may have one or both of anion vacancies 242 and metal cations 244. P-type layer 250 may have one or both of metal cation vacancies 252 and anions 254.

In some implementations, each memristor may be coupled to a selector at its cross point in the crossbar array. Selectors may be electrical devices that may be used in memristor devices to provide desirable electrical properties. For example, selectors may be coupled in series with each memristor to increase the overall nonlinear characteristics of the memristors. Selectors may be based on a number of materials, including metal oxides and metal nitrides. Non-limiting examples include niobium oxide, tantalum oxide, vanadium oxide, titanium oxide, and chromium oxide.

Figure 3A:
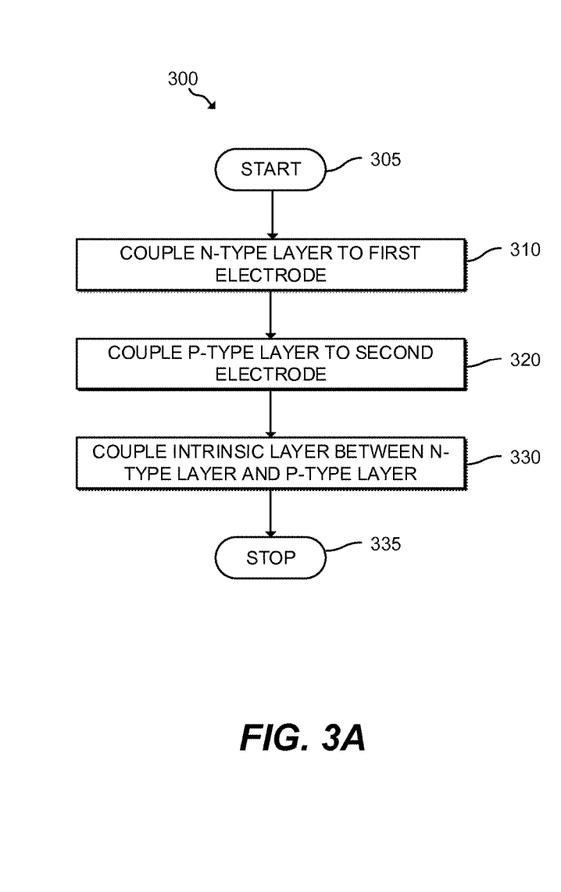
FIG. 3A is a flowchart of an example method for manufacturing a multilayered memristor.

FIG. 3A is a flowchart of an example method 300 for manufacturing a multilayered memristor. Method 300 may include block 310 for coupling an n-type layer of a semiconducting material to a first electrode, block 420 for coupling a p-type layer of a semiconducting material to a second electrode, and block 330 for coupling a semiconducting intrinsic layer between the n-type layer and the p-type layer to form an electrical series connection through the n-type layer and the p-type layer. Although execution of method 300 is herein described in reference to multilayered memristor 230 in relation to crossbar array 200 of FIG. 2, other suitable examples for implementation of method 300 should be apparent, including examples provided in FIG. 1A, FIG. 1B, and FIG. 1C.

Method 300 may start in block 305 and proceed to block 310, where n-type layer 240 is coupled to a first electrode, such as row line 210. Coupling may mean forming an electrically-conducting connection between components. For example, conducting layer 230 may be placed in physical contact with row line 210. In some implementations, row line 210 may be deposited or provided on a substrate. N-type layer 240 may then be deposited on top of the row line.

After coupling n-type layer 240 to row line 210, method 300 may proceed to block 320, where p-type layer 250 is coupled to a second electrode, such as column line 220. For example, p-type layer 250 may be placed in physical contact with column line 220. In some implementations, column line 220 may be deposited or provided on a substrate. P-type layer 250 may then be deposited on top of the column line. Alternatively, the p-type layer may be deposited first and the row line then deposited on top.

After coupling p-type layer 250 to column line 220, method 300 may proceed to block 330, where intrinsic layer 260 is coupled between n-type layer 240 and p-type layer 250. Intrinsic layer 260 may be sandwiched between the n-type layer and the p-type layer and form a continuous electrical series connection through the multilayered memristor 230.

It should be noted that the order of the execution of blocks 310, 320, and 330 shown in FIG. 3A serves merely as an example. These blocks may be executed in any order. For example, row line 210 may first be provided on a substrate. N-type layer 240 may then be deposited onto the row line (block 310). Intrinsic layer 260 may be deposited on top of the n-type layer, and then p-type layer 250 onto intrinsic layer 260 (block 330). Column line 220 may then be deposited onto p-type layer 250 (block 320).

After coupling intrinsic layer 260 between n-type layer 240 and p-type layer 250, method 300 may proceed to block 335 to stop.

Figure 3B:
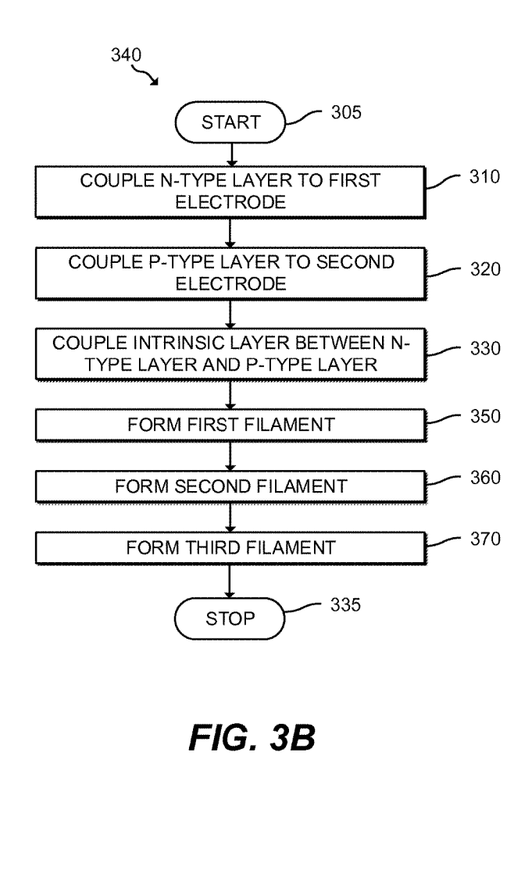
FIG. 3B is a flowchart of the example method of FIG. 3A including forming conducting filaments.

FIG. 3B is a flowchart of the example method 300 of FIG. 3A including forming conducting filaments. The method is labeled 340 in relation to FIG. 3B. In addition to blocks 310, 320, and 330, method 340 may include block 350 for forming a conducting first filament through the n-type layer, block 360 for forming a conducting second filament through the p-type layer, and block 370 for forming a conducting third filament through the intrinsic layer. Although execution of method 340 is herein described in reference to multilayered memristor 140 of FIG. 1B, other suitable examples for implementation of method 340 should be apparent, including examples provided in FIG. 1A, FIG. 1C, and FIG. 2

After the execution of blocks 310, 320, and 330, method 340 may proceed to block 350, where conducting first filament 115 is formed through n-type layer 110. As described herein, first filament 115 may be formed by the movement of charge carriers, such as oxygen vacancies, as a result of the application of a voltage across the memristor. First filament 115 may connect the first electrode coupled to the n-type layer with the intrinsic layer 130 coupled to the n-type layer.

After forming the first filament, method 340 may proceed to block 360, where conducting second filament 125 is formed through p-type layer 120. As described herein, second filament 125 may be formed by the movement of charge carriers, such as metal cation vacancies, as a result of the application of a voltage across the memristor. Second filament 125 may connect the second electrode coupled to the p-type layer with the intrinsic layer 130 coupled to the p-type layer.

After forming the second filament, method 340 may proceed to block 370, where conducting third filament 135 is formed through intrinsic layer 130. As described herein, third filament 125 may be formed by the movement of charge carriers, such as oxygen vacancies from n-type layer 110 and metal cation vacancies from p-type layer 120. Third filament 135 may connect the two edges of intrinsic layer 130 to create a conducting channel through the layer. When connected with the first filament 115 and the second filament 125, intrinsic layer 135 completes a conducting path through the multilayered memristor 140.

The connection of the first, second, and third filaments creates a continuous conducting path through the layers of multilayered memristor 140, thereby facilitating a relatively conducting, low resistance state. It should be noted that the order of the execution of blocks 310, 320, 330, 350, 360, and 370 shown in FIG. 3B serves merely as an example. These blocks may be executed in any order in order to create a continuous conducting filament through multilayered memristor 230.

Figure 3C:
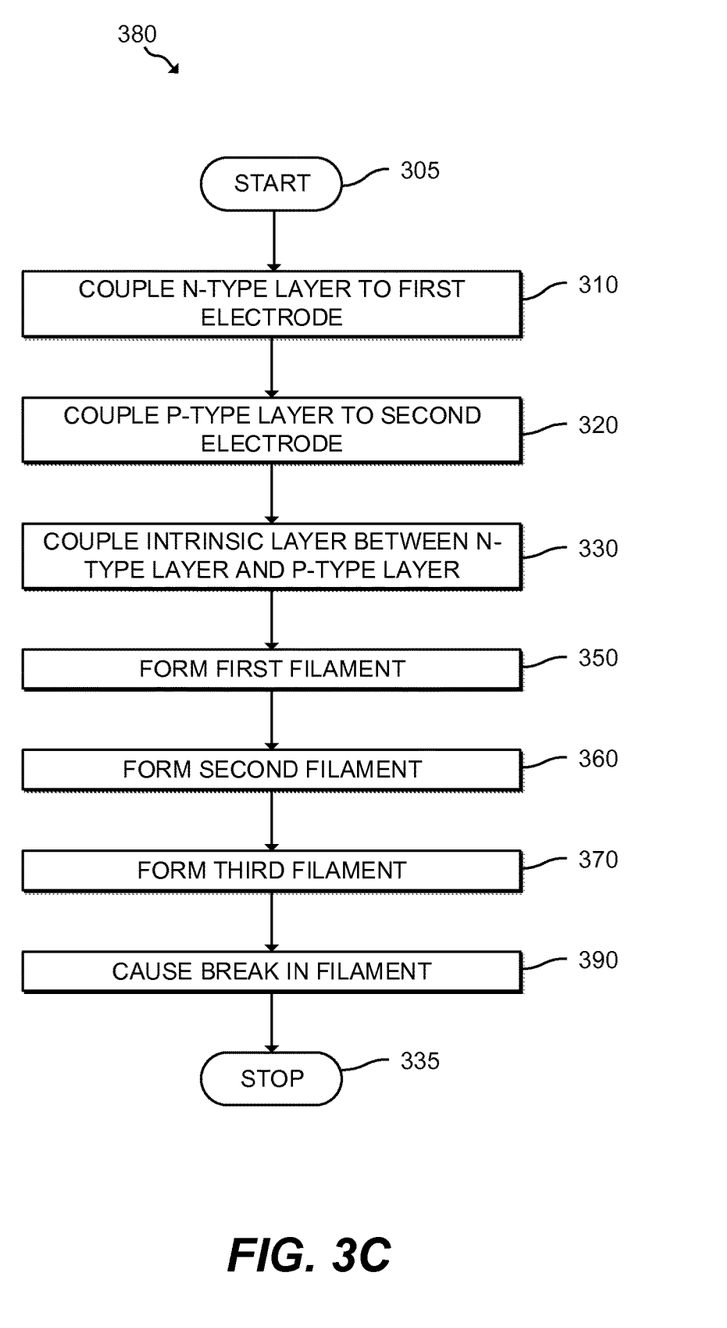
FIG. 3C is a flowchart of the example method of FIG. 3B including causing a break in a conducting filament.

FIG. 3C is a flowchart of the example method 340 of FIG. 3B including causing a break in a conducting filament. The method is labeled 380 in relation to FIG. 3C. In addition to blocks 310, 320, 330, 350, 360, and 370, method 380 may include block 390 for causing a break in at least one of the first filament, the second filament, and the third filament. Although execution of method 380 is herein described in reference to multilayered memristor 150 of FIG. 1C, other suitable examples for implementation of method 380 should be apparent, including examples provided in FIG. 1A, FIG. 1B, and FIG. 2.

After the execution of blocks 310, 320, 330, 350, 360, and 370, method 380 may proceed to block 395, where at least one of break 152, break 154, and break 156 occurs in first filament 115, second filament 125, and third filament 135, respectively. In some implementations, a voltage may cause charge carriers in the n-type layer 110, such as oxygen vacancies 112, to be drawn away from first filament 115 to cause a break 152 in the filament. Analogously, charge carriers in the p-type layer 120, such as metal cation vacancies 122, may be drawn away from second filament 125 to cause a break 154 in the filament. Furthermore, the applied voltage may additionally cause a break 156 in third filament 135 in the intrinsic layer 130, by the movement of the charge carriers away from each other. The breaking of at least one of the first, second, and third filaments breaks the continuous conducting path through the layers of multilayered memristor 140, thereby facilitating a relatively insulating, high resistance state. This switching of the memristor from a low resistance state to a high resistance (breaking of one or more filaments) may be referred to as off-writing or erasing, while the switching of the memristor from a high resistance state to a low resistance state (forming the continuous filament) may be referred to as writing.

The foregoing describes a number of examples for multilayered memristors. It should be understood that the multilayered memristors described herein may include additional components and that some of the components described herein may be removed or modified without departing from the scope of the multilayered memristors or their applications. It should also be understood that the components depicted in the figures are not drawn to scale, and thus, the components may have different relative sizes with respect to each other than as shown in the figures.

It should be noted that, as used in this application and the appended claims, the singular forms "a," "an," and "the" include plural elements unless the context clearly dictates otherwise.

What is claimed is:

1. A multilayered memristor, comprising:
    a semiconducting n-type layer, wherein the n-type layer comprises one or both of anion vacancies and metal cations;
    a semiconducting p-type layer, wherein the p-type layer comprises one or both of metal cation vacancies and anions; and
    a semiconducting intrinsic layer coupled between the n-type layer and the p-type layer to form an electrical series connection through the n-type layer, the intrinsic layer, and the p-type layer.

2. The multilayered memristor of claim 1, wherein the anion vacancies and/or metal cations form a conducting first filament through the n-type layer, and wherein the metal cation vacancies and/or anions form a conducting second filament through the p-type layer.

3. The multilayered memristor of claim 2, wherein the first filament connects the intrinsic layer and an outer surface of the n-type layer when the multilayered memristor is in a low resistance state, and wherein the second filament connects the intrinsic layer and an outer surface of the p-type layer when the multilayered memristor is in the low resistance state.

4. The multilayered memristor of claim 2, wherein one or both of the first filament and the second filament has a break when the multilayered memristor is in a high resistance state.

5. The multilayered memristor of claim 1, wherein the intrinsic layer forms a conducting third filament when the multilayered memristor is in a low resistance state, and wherein the third filament has a break when the multilayered memristor is in a high resistance state.

6. The multilayered memristor of claim 5, wherein the third filament is formed by anion vacancies of the n-type layer and metal cation vacancies of the p-type layer.

7. The multilayered memristor of claim 1, wherein:
    the intrinsic layer permits passage of both anion vacancies and metal cation vacancies; and the intrinsic layer permits blocking of both anion vacancies and metal cation vacancies.

8. The multilayered memristor of claim 1, wherein the anions comprise oxygen anions, and the anion vacancies comprise oxygen anion vacancies.

9. The multilayered memristor of claim 1, wherein, under influence of a forming voltage, a conducting filament forms through and across all of the n-type layer, p-type layer and intrinsic layer, the conducting filament being formed from the anion vacancies, cation vacancies, anions or cations of the n-type and p-type layers.

10. The multilayered memristor of claim 1, wherein, in the n-type layer, electrons are a majority charge carrier and holes are a minority charge carrier; and in the p-type layer, holes are the majority charge carrier and electrons are the minority charge carrier.

11. The multilayered memristor of claim 1, wherein the anion vacancies of e n-type layer are oxygen anion vacancies.

12. The multilayered memristor of claim 1, wherein the metal cations of the n-type layer are Indium, Zn, Mg, Sn, or Ga.

13. A crossbar array, comprising:
a plurality of word lines;
a plurality of bit lines; and
a plurality of multilayered memristors, wherein each memristor is coupled between a word line of the plurality of word lines and a bit line of the plurality of hit lines, and wherein each memristor comprises:
a semiconducting n-type layer, wherein the n-type layer comprises one or both of anion vacancies and metal cations;
a semiconducting p-type layer, wherein the p-type layer comprises one or both of metal cation vacancies and anions; and
a semiconducting intrinsic layer coupled between the n-type layer and the p-type layer to form an electrical series connection through the n-type layer, the intrinsic layer, and the p-type layer.

14. The crossbar array of claim 13, wherein the anion vacancies and/or metal cations form a conducting first filament through the n-type layer, and wherein the metal cation vacancies and/or anions form a conducting second filament through the p-type layer.

15. The crossbar array of claim 14, wherein:
the first filament connects the intrinsic layer and an outer surface of the n-type layer when the multilayered memristor is in a low resistance state;
the second filament connects the intrinsic layer and an outer surface of the p-type layer when the multilayered memristor is in the low resistance state; and
the intrinsic layer forms a conducting third filament when the multilayered memristor is in the low resistance state, wherein the third filament is formed by anion vacancies of the n-type layer and metal cation vacancies of the p-type layer.

16. The crossbar array of claim 15, wherein at least one of the first filament, the second filament, and the third filament has a break when the multilayered memristor is in a high resistance state.

17. A method for manufacturing a multilayered memristor, comprising:
coupling a n-type layer of a semiconducting material to a first electrode, wherein the n-type layer comprises one or both of anion vacancies and metal cations;
coupling a p-type layer of a semiconducting material to a second electrode, wherein the p-type layer comprises one or both of metal cation vacancies and anions; and
coupling a semiconducting intrinsic layer between the n-type layer and the p-type layer to form an electrical series connection through the n-type layer, the intrinsic layer, and the p-type layer.

18. The method of claim 17, further comprising:
forming a conducting first filament through the n-type layer;
forming a conducting second filament through the p-type layer; and
forming a conducting third filament through the intrinsic layer.

19. The method of claim 18, further comprising causing a break in at least one of the first filament, the second filament, and the third filament.

20. The method of claim 17, comprising applying an electrical field to form a conducting filament between the first and second electrodes, and further comprising:
forming a conducting first filament through the n-type layer, the conducting first filament being formed from the anion Vacancies or metal cations in the n-type layer;
forming a conducting second filament through the p-type layer, the conducting second filament being formed from the metal cation vacancies or anions in the p-type layer;
forming a conducting third filament through the intrinsic layer, the conducting third filament being formed from the anion vacancies or metal cations from the n-type layer and from the metal cation vacancies or anions from the p-type layer; and
causing a break in at least one of the first filament, the second filament, and the third filament.

* * * * *